June 2, 1970 W. T. LYNCH 3,514,846

METHOD OF FABRICATING A PLANAR AVALANCHE PHOTODIODE

Filed Nov. 15, 1967

INVENTOR
W.T. LYNCH
BY
Arthur J. Torsiglieri
ATTORNEY

United States Patent Office 3,514,846
Patented June 2, 1970

3,514,846

METHOD OF FABRICATING A PLANAR AVALANCHE PHOTODIODE

William T. Lynch, Summit, N.J., assignor to Bell Telephone Laboratories, Incorporated, Murray Hill and Berkeley Heights, N.J., a corporation of New York Filed Nov. 15, 1967, Ser. No. 683,271
Int. Cl. H01l *15/02*
U.S. Cl. 29—572 1 Claim

ABSTRACT OF THE DISCLOSURE

An avalanche junction with uniform breakdown characteristics is fabricated by growing on a p+ substrate an n-type epitaxial layer and thereafter converting all but a central portion of the epitaxial layer to p-type. Connections are provided to the central n-type portion and the p+ type substrate. Such a fabrication process results in a device including a p-n junction which has a planar central portion having a low characteristic breakdown voltage and a curved edge portion having a higher characteristic breakdown voltage. Accordingly, the breakdown can be limited to the planar central portion where it can be expected to be more uniform. The process is especially useful in the fabrication of an avalanche photodiode.

BACKGROUND OF THE INVENTION

This invention relates to the fabrication of semiconductor devices including a junction which is to be operated in avalanche breakdown. The invention has special application to the fabrication of avalanche photodiodes useful as detectors of high frequency modulation on an optical beam.

There is now available a class of semiconductive devices which are designed to be operated with a bias on one junction in the avalanche or multiplication region of their voltage-current characteristic. A form of such device, with reference to which it will be convenient to describe the invention specifically, is the avalanche photodiode which is designed to be exposed to a modulated light beam whereby there may be derived a measure of the modulation envelope of the beam. Typically diodes of this kind have been planar diodes which include a junction formed by diffusion through an appropriate mask of an impurity able to convert the conductivity type of the diffused region. Such a junction is characterized by a planar central portion and a curved surrounding edge portion which intersects the surface. The geometry of such a diode favors the occurrence of breakdown at either the surface or at the curved edge of the junction. However such breakdown is generally less desirable than breakdown in the bulk over the large area central planar portion of the junction.

Various techniques have been suggested to insure bulk rather than surface breakdown in avalanche diodes, particularly to increase the diode breakdown voltage. Typical of one such technique is that described in U.S. Pat. 3,345,211 in which a high resistivity epitaxial layer of one conductivity type is grown on a low resistivity substrate of like conductivity type and thereafter an impurity is diffused into a localized portion of the wafer to form a zone of the opposite conductivity type which penetrates the epitaxial layer into the substrate. A diode fabricated in this way does avoid the surface breakdown problem but there still remains the problem that the curved edge portion of the junction tends to have a lower breakdown than the central planar portion, and as a consequence the breakdown tends to be nonuniform and quite noisy. This is particularly undesirable when the diode is to be used as a photodiode for the detection of high frequency modulation on a light beam where high sensitivity, high efficiency and low noise are particularly advantageous.

Another technique which has been employed to allow breakdown of the central planar portion of the junction before surface or edge breakdown has been the use of a guard ring or low resistivity surrounding zone. However, this tends to add excess capacitance and resistance to the diode, both of which act to limit the available output power and the high frequency response.

An object of the present invention is an avalanche diode, particularly one useful as a photodiode, which avoids the tendency to edge or surface breakdown without sacrificing efficiency and high speed of response.

SUMMARY OF THE INVENTION

To this end, the present invention provides a process for the convenient fabrication of an avalanche diode of the desired characteristics. In particular, it is a process which avoids the step of overdoping to convert a highly doped region to the opposite conductivity type but higher resistivity, a step which is not amenable to close control in a practical manufacturing process.

In a preferred embodiment of the invention, an avalanche photodiode is prepared essentially as follows. There is first prepared a silicon crystal which includes a heavily doped p-type bulk on the active surface of which there extends a lightly doped thin n-type layer. Typically, the n-type layer will be formed by an epitaxial growth process. Then the portion of the layer which is to define the photosensitive area is masked and an acceptor impurity is diffused into the wafer to isolate such region within a surrounding lightly doped p-type region which penetrates to the heavily doped substrate. Thereafter, a transparent electrode is provided on the isolated n-type region and the second electrode to the original substrate to form the diode. Generally, it will be preferable to provide a thin surface layer of low resistivity on the n-type region where the transparent electrode is to be connected.

DESCRIPTION OF ILLUSTRATIVE EMBODIMENT

Figure 1:
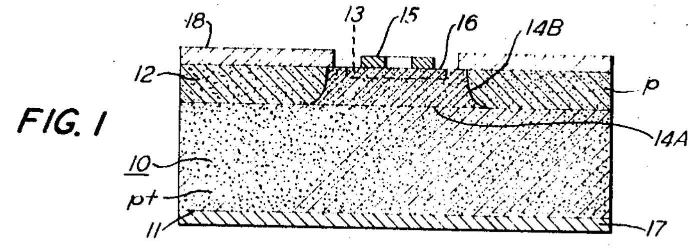
FIG. 1 shows in cross section a photodiode fabricated in accordance with the invention.

In the photodiode depicted in FIG. 1, a monocrystalline silicon wafer 10 is composed of a bulk portion 11 which is of low resistivity p-type material and a surface portion which includes the high resistivity p-type region 12 which surrounds the localized high resistivity n-type region 13. This latter region forms a substantially planar p-n junction portion 14A with the bulk portion 11 and a curved edge portion 14B with the p-type region 12. Accordingly along entire junction portion 14B there are separated two regions of relatively high resistivity, thereby ensuring a relatively high breakdown voltage. However along junction portion 14A, there are separated a high resistivity region and a low resistivity region thereby ensuring that avalanching will occur at a relatively low voltage. Accordingly, the diode can be biased to a value to permit avalanche operation in the planar central portion of the junction without causing breakdown at the curved edge portions of the junction. The resulting large area breakdown provides a uniform multiplication region for the detection and amplification of an incident light beam.

An electrode 15 designed to be transparent to light, either by being sufficiently thin or by including openings such as provided by a serpentine pattern, makes low resistance connection to the n-type region. To facilitate such connection it is advantageous to provide a low resistivity surface 16 where contact is to be made, as by a shallow donor diffusion. However, such low resistivity surface should not extend to the p-n junction.

A second electrode 17 makes low resistance connection to the bulk at the opposite major face of the wafer. It is also generally desirable to include a passivating oxide layer 18 over most of the active surface, particularly where the junction intersects the surface.

Typical dimensions are an overall wafer thickness of about 5 mils and a diameter of about 15 mils, with n-type region 13 having a thickness of about 5 microns and a diameter of about 7 mils, and the low resistivity surface region 16 a thickness of about 0.1 micron and a diameter of about 5 mils. The oxide layer 18 has a thickness of about 5,000 angstrom units.

Figure 2A:
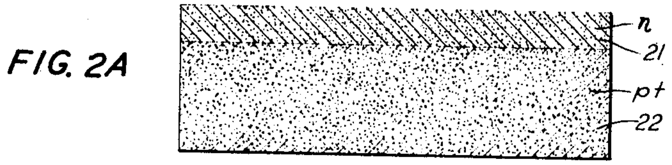
FIGS. 2A through 2E show the photodiode of FIG. 1 in various stages of its manufacture.

In accordance with the preferred embodiment of the invention, a photodiode of the kind shown was made as follows:

As starting material, there was employed a monocrystalline silicon wafer in which boron was the predominant significant impurity with a concentration of about $5\times10^{17}$ atoms per cubic centimeter to result in a p-type resistivity of about 0.1 ohm-centimeter. On one surface of this there was grown in conventional fashion an epitaxial layer about 12 microns thick in which arsenic was the predominant impurity with a concentration of about $10^{16}$ atoms per cubic centimeter to result in an n-type resistivity of about 0.5 ohm-centimeter. The resulting structure is shown in FIG. 2A where the epitaxial n-type layer 21 is shown on the original p+ type substrate 22.

Thereafter over the epitaxial layer there was grown a 6000 angstroms thick oxide layer by maintaining the wafer in steam for about one hour at 1050° C. for thermal conversion of a portion of the epitaxial layer.

Figure 2B:
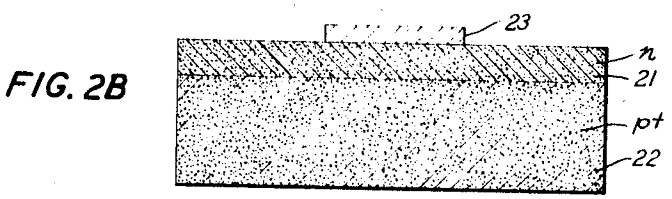

Then by conventional techniques, the oxide layer was processed to leave only spaced islands of oxide of about 7 mils in diameter. In FIG. 2B is shown the resulting structure with spaced oxide island 23 on the epitaxial layer 21.

Figure 2C:
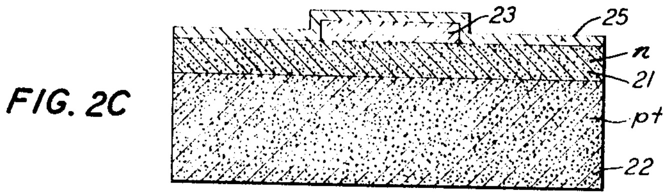
Figure 2D:
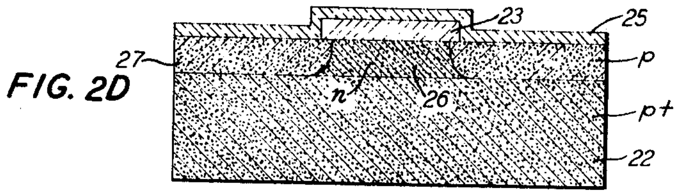

Next there is deposited over the epitaxial layer and the oxide islands a layer about 5000 angstroms thick of boron-doped silicon dioxide. The oxide was deposited by flowing past the wafer while it was maintained at 650° C. a nitrogen carrier stream different portions of which had earlier flowed past ethylorthosilicate and trimethyl borate source materials, respectively. The proportions were such as to provide a concentration of about $2\times10^{17}$ boron atoms per cubic centimeter in the boron-rich oxide. The resultant structure is shown in FIG. 2C where boron-rich oxide layer 25 overlies the surface of the wafer.

Thereafter the boron in the oxide is diffused into the underlying silicon in regions unprotected by the silicon oxide islands. Heating the wafer at about 1200° C. for about 32 hours in a nitrogen atmosphere results in penetration by the boron of the epitaxial n-type layer to the underlying substrate in regions unprotected by the silicon oxide islands. As a consequence, only the central portion 26 of the original epitaxial layer is left as n-type, the surrounding portion forming the lightly doped p-type region 27. Additionally since the dopant in the original substrate was also boron, boron outdiffusion from the substrate into the epitaxial layer serves to reduce the effective depth of the n-type island 26 in the epitaxial layer.

The use of the boron-rich oxide as the diffusion source permits close control of the boron concentration in the converted regions of the epitaxial layer and insures that there will not result any heavily doped p-type region therein.

By conventional techniques, there is exposed the central portion of the surface of the n-type regions by etching away selectively the overlying oxide layers and a highly doped n-type skin is formed by a shallow phosphorous diffusion over the central portion of n-type layer 26.

Then successive layers of titanium and aluminum are evaporated over the highly doped skin and by conventional etching techniques there is formed of such layers a grid pattern of stripes which forms a low resistance ohmic connection to the n-type zone.

A separate low resistance connection of gold is made to the bulk on the opposite major face of the wafer.

Figure 2E:
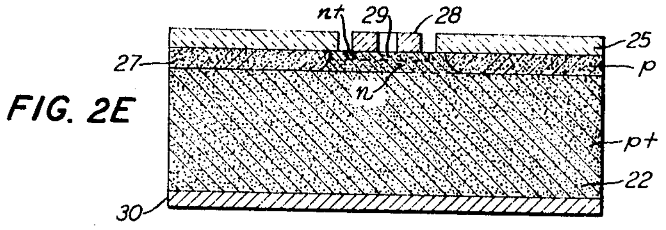

The resultant is shown in FIG. 2E and essentially has the form of the structure shown in FIG. 1 with light transparent electrode 28 contacting the low resistivity skin 29 of n-type region 26 and electrode 30 contacting the bulk.

Thereafter the diode should be packaged in a structure which permits the entrance of light to be incident on the photosensitive area associated with layer 26.

It should be evident that the specific embodiment described is merely illustrative of the general principles of the invention and that various modifications are feasible without departing from the spirit and scope of the invention. For example, the invention may be practiced to form a p-n+ junction. Additionally, materials other than those specifically mentioned obviously may be used instead.

It is also to be understood that the invention may be employed to form avalanche junctions in other devices, such as avalanche transistors in which the base-collector junction is biased to avalanche breakdown, which is desirably uniform over the collecting junction.

What is claimed is:

1. A method for production of an avalanche diode useful as a photodiode comprising the steps of:

forming on a relatively low resistivity substrate of semiconductor material of one conductivity type an epitaxial layer of the opposite conductivity type of relatively high resistivity;

forming over the epitaxial layer an undoped oxide layer;

removing the oxide layer except for a selected region;

forming an impurity doped oxide over the surface of said semiconductive material including the selected region;

subsequently heating the material sufficiently to cause diffusion of the impurity from the doped oxide into the region not protected by the undoped oxide;

removing the undoped oxide from part of the selected region, and then providing a transparent electrode connection to such part and another electrode connection to the substrate, whereby the device is useful as a photodiode.

References Cited

UNITED STATES PATENTS

| | | | |
|---|---|---|---|
| 2,761,945 | 9/1956 | Colbert et al. | 29—572 X |
| 2,914,715 | 11/1959 | Uhlir | 317—234 |
| 3,203,840 | 8/1965 | Harris. | |
| 3,261,727 | 7/1966 | Dehmont et al. | |
| 3,289,267 | 12/1966 | Ullrich. | |
| 3,319,311 | 5/1967 | Mutter | 29—578 |
| 3,345,221 | 10/1967 | Lesk | 148—175 |
| 3,416,044 | 12/1968 | Dreyfus et al. | 29—572 X |

PAUL M. COHEN, Primary Examiner

U.S. Cl. X.R.

136—89; 29—589, 578